United States Patent
Yoon et al.

(10) Patent No.: US 9,859,255 B1
(45) Date of Patent: Jan. 2, 2018

(54) ELECTRONIC DEVICE PACKAGE

(71) Applicant: Intel Corporation, Santa Clara, CA (US)

(72) Inventors: Jh Yoon, Seoul (KR); Yong She, Folsom, CA (US); Mao Guo, Folsom, CA (US); Richard Patten, Langquaid (DE)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/283,342

(22) Filed: Oct. 1, 2016

(51) Int. Cl.
*H01L 25/065* (2006.01)
*H01L 23/31* (2006.01)
*H01L 23/00* (2006.01)
*H01L 23/29* (2006.01)
*H01L 25/18* (2006.01)
(Continued)

(52) U.S. Cl.
CPC ........ *H01L 25/0657* (2013.01); *H01L 21/565* (2013.01); *H01L 21/76802* (2013.01); *H01L 21/76877* (2013.01); *H01L 23/293* (2013.01); *H01L 23/3128* (2013.01); *H01L 24/16* (2013.01); *H01L 24/32* (2013.01); *H01L 24/48* (2013.01); *H01L 24/81* (2013.01); *H01L 24/85* (2013.01); *H01L 25/18* (2013.01); *H01L 25/50* (2013.01); *H01L 2224/0231* (2013.01); *H01L 2224/0237* (2013.01); *H01L 2224/0239* (2013.01); *H01L 2224/13024* (2013.01); *H01L 2224/13147* (2013.01); *H01L 2224/32145* (2013.01); *H01L 2224/48091* (2013.01); *H01L 2224/48106* (2013.01); *H01L 2224/48227* (2013.01); *H01L 2224/73215* (2013.01); *H01L 2224/73253* (2013.01); *H01L 2225/0651* (2013.01); *H01L 2225/06517* (2013.01); *H01L 2225/06548* (2013.01); *H01L 2225/06575* (2013.01); *H01L 2924/0665* (2013.01);
(Continued)

(58) Field of Classification Search
CPC . H01L 25/0657; H01L 23/3128; H01L 24/16; H01L 24/48; H01L 23/293; H01L 24/32; H01L 25/18; H01L 21/565; H01L 24/08; H01L 24/85; H01L 25/50; H01L 21/76802; H01L 21/76877; H01L 25/067
See application file for complete search history.

(56) References Cited

U.S. PATENT DOCUMENTS 8,815,645 B2 * 8/2014 Lee .................. H01L 21/561
  438/118
8,861,221 B2 * 10/2014 Pagaila ............ H01L 23/3157
  361/783

(Continued)

*Primary Examiner* — William Coleman
(74) *Attorney, Agent, or Firm* — Thorpe North & Western, LLP; David W. Osborne (57) ABSTRACT

Electronic device package technology is disclosed. An electronic device package in accordance with the present disclosure can include a package substrate, an electronic component, a mold compound encapsulating the electronic component, and a redistribution layer disposed such that the mold compound is between the package substrate and the redistribution layer. The redistribution layer and the package substrate can be electrically coupled. In addition, the redistribution layer and the electronic component can be electrically coupled to electrically couple the electronic component and the package substrate. Associated systems and methods are also disclosed.

23 Claims, 3 Drawing Sheets

(51) Int. Cl.
*H01L 21/56* (2006.01)
*H01L 25/00* (2006.01)
*H01L 21/768* (2006.01)

(52) U.S. Cl.
CPC ............... *H01L 2924/1433* (2013.01); *H01L 2924/1434* (2013.01); *H01L 2924/15311* (2013.01)

(56) References Cited

U.S. PATENT DOCUMENTS

| | | | |
|---|---|---|---|
| 8,970,049 B2* | 3/2015 | Karnezos | H01L 23/4334 257/686 |
| 9,224,717 B2* | 12/2015 | Sato | H01L 23/13 |
| 2010/0155920 A1* | 6/2010 | Lee | H01L 25/105 257/686 |
| 2010/0232129 A1* | 9/2010 | Haba | G01R 31/2886 361/783 |
| 2013/0234317 A1* | 9/2013 | Chen | H01L 25/50 257/737 |
| 2015/0262909 A1* | 9/2015 | Chen | H01L 21/6835 257/774 |
| 2017/0033062 A1* | 2/2017 | Liu | H01L 23/66 |

* cited by examiner

ELECTRONIC DEVICE PACKAGE

TECHNICAL FIELD

Embodiments described herein relate generally to electronic device packages, and more particularly to interconnecting components in electronic device packages.

BACKGROUND

Integrated circuit packaging often includes two or more electronic components in a stacked configuration electrically coupled to a package substrate. This arrangement provides a space savings and has therefore become increasingly popular for small form factor applications due to the higher component density that can be provided in devices such as mobile phones, personal digital assistants (PDA), and digital cameras. Some package configurations stack a memory component (e.g., DRAM, SRAM, FLASH, etc.) on a logic or processor component and are known as mixed logic-memory stacks. A logic or processor component can include an application specific integrated circuit (ASIC), such as a processor and/or a system on a chip (SOC), which may integrate a CPU, a GPU, a memory controller, a video decoder, an audio decoder, a video encoder, a camera processor, system memory, and/or a modem onto a single chip.

BRIEF DESCRIPTION OF THE DRAWINGS

Invention features and advantages will be apparent from the detailed description which follows, taken in conjunction with the accompanying drawings, which together illustrate, by way of example, various invention embodiments; and, wherein.

Reference will now be made to the exemplary embodiments illustrated, and specific language will be used herein to describe the same. It will nevertheless be understood that no limitation of the scope or to specific invention embodiments is thereby intended.

DESCRIPTION OF EMBODIMENTS

Before invention embodiments are disclosed and described, it is to be understood that no limitation to the particular structures, process steps, or materials disclosed herein is intended, but also includes equivalents thereof as would be recognized by those ordinarily skilled in the relevant arts. It should also be understood that terminology employed herein is used for the purpose of describing particular examples only and is not intended to be limiting. The same reference numerals in different drawings represent the same element. Numbers provided in flow charts and processes are provided for clarity in illustrating steps and operations and do not necessarily indicate a particular order or sequence. Unless defined otherwise, all technical and scientific terms used herein have the same meaning as commonly understood by one of ordinary skill in the art to which this disclosure belongs.

As used in this written description, the singular forms "a," "an" and "the" provide express support for plural referents unless the context clearly dictates otherwise. Thus, for example, reference to "a layer" includes a plurality of such layers.

In this application, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the composition's nature or characteristics would be permissible if present under the "consisting essentially of" language, even though not expressly recited in a list of items following such terminology. When using an open ended term in the written description like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein.

The term "coupled," as used herein, is defined as directly or indirectly connected in an electrical or nonelectrical manner. Objects described herein as being "adjacent to" each other may be in physical contact with each other, in close proximity to each other, or in the same general region or area as each other, as appropriate for the context in which the phrase is used.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, sizes, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment. Occurrences of the phrase "in one embodiment," or "in one aspect," herein do not necessarily all refer to the same embodiment or aspect.

Furthermore, the described features, structures, or characteristics may be combined in any suitable manner in one or more embodiments. In this description, numerous specific details are provided, such as examples of layouts, distances, network examples, etc. One skilled in the relevant art will recognize, however, that many variations are possible without one or more of the specific details, or with other methods, components, layouts, measurements, etc. In other instances, well-known structures, materials, or operations are not shown or described in detail but are considered well within the scope of the disclosure.

Circuitry used in electronic components or devices (e.g. a die) of an electronic device package can include hardware, firmware, program code, executable code, computer instructions, and/or software. Electronic components and devices can include a non-transitory computer readable storage medium, which can be a computer readable storage medium that does not include signal. In the case of program code execution on programmable computers, the computing devices recited herein may include a processor, a storage medium readable by the processor (including volatile and non-volatile memory and/or storage elements), at least one input device, and at least one output device. Volatile and non-volatile memory and/or storage elements may be a RAM, EPROM, flash drive, optical drive, magnetic hard drive, solid-state drive, or other medium for storing electronic data. Node and wireless devices may also include a transceiver module, a counter module, a processing module, and/or a clock module or timer module. One or more programs that may implement or utilize any techniques described herein may use an application-programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and combined with hardware implementations.

Example Embodiments

An initial overview of technology embodiments is provided below and specific technology embodiments are then described in further detail. This initial summary is intended to aid readers in understanding the technology more quickly but is not intended to identify key or essential features of the technology nor is it intended to limit the scope of the claimed subject matter.

Although electronic device packages with electronic component stacks are in widespread use, a typical package with stacked electronic components has electrical interconnect configurations that limit size reduction. In particular, such packages utilize wire bond connections between multiple stacked components and the package substrate, which impact package dimensions through requirements on wire bond loop height and wire sweep control during assembly processes therefore limiting minimum package profile size (e.g., in X, Y, and/or Z dimensions).

Accordingly, an electronic device package is disclosed that avoids wire bonding and associated space limitations for electrically interconnecting at least one electrical component in a stack with a package substrate. In one aspect, such electrical interconnection utilizes a conductive pillar or a vertical wire bond to route signals through a redistribution layer for connection with the package substrate. In one example, an electronic device package in accordance with the present disclosure can comprise a package substrate, an electronic component, a mold compound encapsulating the electronic component, and a redistribution layer disposed such that the mold compound is between the package substrate and the redistribution layer. The redistribution layer and the package substrate can be electrically coupled. In addition, the redistribution layer and the electronic component can be electrically coupled to electrically couple the electronic component and the package substrate. Associated systems and methods are also disclosed.

Figure 1:
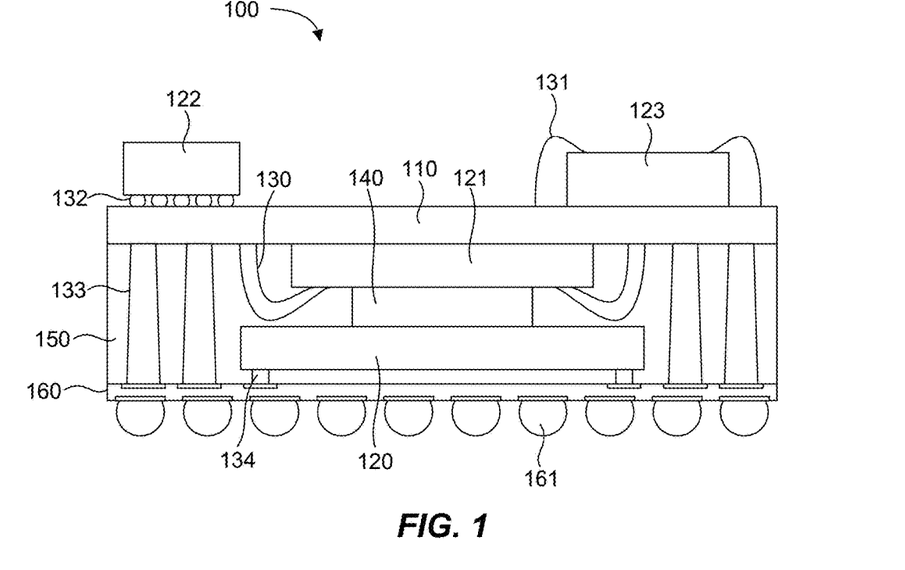
FIG. 1 illustrates a schematic cross-section of an electronic device package in accordance with an example.

Referring to FIG. 1, an exemplary electronic device package 100 is schematically illustrated in cross-section. The electronic device package 100 can include a substrate 110. The electronic device package 100 can also include one or more electronic components 120-123, which can be operably coupled to the substrate 110. An electronic component can be any electronic device or component that may be included in an electronic device package, such as a semiconductor device (e.g., a die, a chip, a processor, computer memory, etc.). In one embodiment, each of the electronic components 120-123 may represent a discrete chip, which may include an integrated circuit. The electronic components 120-123 may be, include, or be a part of a processor, memory (e.g., ROM, RAM, EEPROM, flash memory, etc.), or an application specific integrated circuit (ASIC). In some embodiments, one or more of the electronic components 120-123 can be a system-on-chip (SOC) or a package-on-package (POP). In some embodiments, the electronic device package 100 can be a system-in-a-package (SIP).

Although four electronic components 120-123 are depicted in FIG. 1, any suitable number of electronic components can be included. The electronic components 120-123 can be attached to the substrate 110 according to a variety of suitable configurations including wire bonding, a flip chip configuration, and the like, certain aspects of which are discussed in more detail below. One or more of the electronic components 120-123 can be electrically coupled to the substrate 110 using interconnect structures (e.g., the illustrated wire bonds 130, 131 and/or solder balls 132) configured to route electrical signals between the electronic components and the substrate 110. In some embodiments, the interconnect structures may be configured to route electrical signals such as, for example, I/O signals and/or power or ground signals associated with the operation of the electronic components 120-123.

The substrate 110 may include typical substrate materials. For example, the substrate may comprise as an epoxy-based laminate substrate having a core and/or build-up layers. The substrate 110 may include other suitable types of substrates in other embodiments. For example, the substrate can be formed primarily of any suitable semiconductor material (e.g., a silicon, gallium, indium, germanium, or variations or combinations thereof, among other substrates), one or more insulating layers, such as glass-reinforced epoxy, such as FR-4, polytetrafluoroethylene (Teflon), cotton-paper reinforced epoxy (CEM-3), phenolic-glass (G3), paper-phenolic (FR-1 or FR-2), polyester-glass (CEM-5), ABF (Ajinomoto Build-up Film), any other dielectric material, such as glass, or any combination thereof, such as can be used in printed circuit boards (PCBs).

The substrate 110 may include electrical routing features configured to route electrical signals to or from the electronic components 120-123. The electrical routing features may be internal and/or external to the substrate 110. For example, in some embodiments, the substrate 110 may include electrical routing features such as pads, vias, and/or traces (not shown) as commonly known in the art configured to receive the interconnect structures (e.g., wire bonds 130, 131 and solder balls 132) and route electrical signals to or from the electronic components 120-123. The pads, vias, and traces of the substrate 110 can be constructed of the same or similar electrically conductive materials, or of different electrically conductive materials.

The electronic components 120-123 can be disposed about the package substrate 110 in any suitable configuration or arrangement. For example, as illustrated in FIG. 1, the electronic components 120, 121 are disposed on a side of the package substrate 110 opposite the electronic components 122, 123. In one aspect, the electronic components 120, 121 can be in a stacked relationship, for example, to save space and enable smaller form factors. It should be recognized that any suitable number of electronic components can be included in a stack. In one embodiment, the electronic component 121 can comprise an integrated circuit (e.g., an ASIC), which can be a logic or processor package, and the electronic component 120 can comprise computer memory (e.g., DRAM, SRAM, FLASH, etc.) to form a mixed logic-memory stack. A spacer 140, such as a silicon spacer, can separate the electronic component 120 and the electronic component 121 to provide clearance for the wire bond connection 130. A mold compound material 150 (e.g., an epoxy) can encapsulate one or more of the electronic components. For example, FIG. 1, shows the mold compound 150 encapsulating the stacked electronic components 120, 121.

The electronic device package 100 can also include a redistribution layer 160. The redistribution layer 160 can be disposed such that the mold compound 150 is between the package substrate 110 and the redistribution layer 160. The redistribution layer 160 and the package substrate 110 can be electrically coupled, such as by electrical interconnect features 133 extending through the mold compound 150. Any suitable electrical interconnect feature may be incorporated to electrically couple the redistribution layer 160 and the package substrate 110. For example, the electrical interconnect feature 133 can comprise one or more through-mold vias. A via can be formed through the mold compound 150 by any suitable technique or process. For example, an opening can be formed in the mold compound and conductive material can be deposited in the opening. An opening can be formed in the mold compound by any suitable technique or process, such as laser drilling, etching, etc. Conductive material can be deposited in the opening by any suitable technique or process, such as plating, printing, sputtering, etc.

The redistribution layer 160 and the electronic component 120 can be electrically coupled to electrically couple the electronic component 120 and the package substrate 110. For example, the redistribution layer 160 and the electronic component 120 can be electrically coupled by one or more electrical interconnect features 134, which may extend through the mold compound 150. Any suitable electrical interconnect feature may be incorporated to electrically couple the redistribution layer 160 and the electronic component 120. Typically, such electrical interconnect features will be low-profile or compact to facilitate minimizing package profile dimensions. For example, the electrical interconnect feature 134 can comprise a conductive pillar (e.g., made a metal material such as copper) and/or a wire bond connection (e.g., a vertical wire bond connection). A conductive pillar can be formed by forming an opening in the mold compound 150 and depositing conductive material in the opening. An opening can be formed in the mold compound by any suitable technique or process, such as laser drilling, etching, etc. Conductive material can be deposited in the opening by any suitable technique or process, such as plating, printing, sputtering, etc. In one aspect, the electrical interconnect feature 134 can be formed extending from the electronic component 120 prior to encapsulation in the mold compound 150.

In one aspect, the redistribution layer 160 can be configured to facilitate electrically coupling the electronic device package 100 with an external electronic component, such as a substrate (e.g., a circuit board such as a motherboard) to further route electrical signals and/or to provide power. The electronic device package 100 can include interconnects, such as solder balls 161, coupled to the redistribution layer 160 for electrically coupling the electronic device package 100 with an external electronic component.

The redistribution layer 160 may include any suitable material, such as typical semiconductor materials and/or dielectric materials. In one embodiment, the redistribution layer 160 may comprise an epoxy-based laminate structure. The redistribution layer 160 may include other suitable materials or configurations in other embodiments. For example, the redistribution layer 160 can be formed of any suitable semiconductor material (e.g., a silicon, gallium, indium, germanium, or variations or combinations thereof, among other substrates), one or more insulating materials, such as glass-reinforced epoxy, such as FR-4, polytetrafluoroethylene (Teflon), cotton-paper reinforced epoxy (CEM-3), phenolic-glass (G3), paper-phenolic (FR-1 or FR-2), polyester-glass (CEM-5), ABF (Ajinomoto Build-up Film), any other dielectric material, such as glass, or any combination thereof, such as can be used in a redistribution layer.

The redistribution layer 160 may include electrical routing features configured to route electrical signals and/or power between the electronic component 120 and the package substrate 110 via the electrical interconnects 133. In addition, the redistribution layer 160 may include electrical routing features configured to route electrical signals and/or power between any electronic component 120-123 and an external electronic component via the solder balls 161. The electrical routing features may be internal and/or external to the redistribution layer 160. For example, in some embodiments, the redistribution layer 160 may include electrical routing features such as pads, vias, and/or traces as commonly known in the art configured to receive the interconnect structures (e.g., vias 133, conductive pillars or wire bonds 134 and solder balls 161) and route electrical signals between the electronic component 120 and the vias 133 and/or the solder balls 161, and/or between the vias 133 and the solder balls 161. The pads, vias, and traces of the redistribution layer 160 can be constructed of the same or similar electrically conductive materials, or of different electrically conductive materials.

Figure 2:
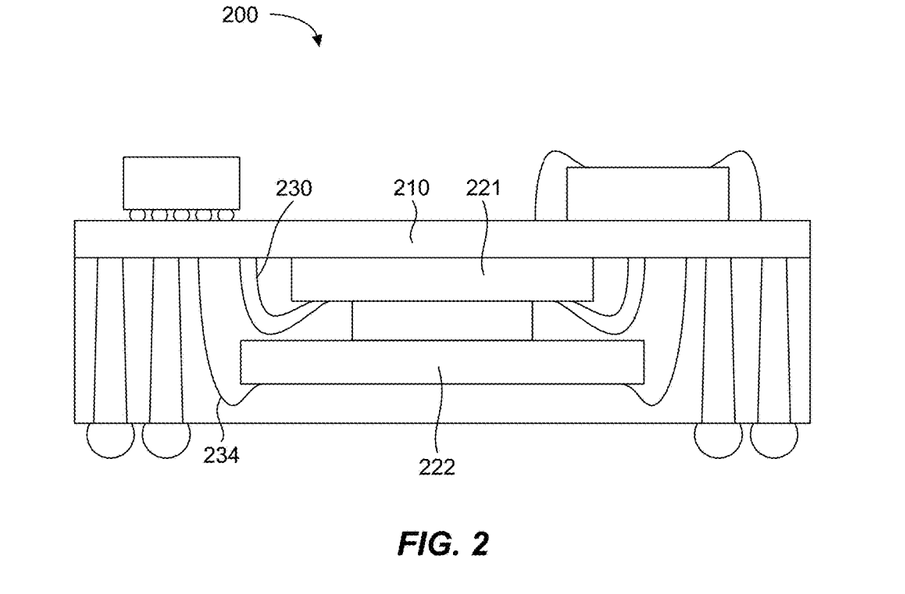
FIG. 2 illustrates a schematic cross-section of an electronic device package in accordance with an example.

An electronic device package as disclosed herein, such as the electronic device package 100, can provide certain benefits over other electronic device package designs, an example of which is schematically illustrated in cross-section in FIG. 2. One design for an electronic device package 200 uses wire bonding technology (e.g., wire bonds 230, 234) for electrical interconnection of multiple stacked electronic components 220, 221 with a package substrate 210. Thus, wire bonding loop height and wire sweep must be controlled for the wire bonds 230, 234 of the stacked components 220, 231 during the assembly process, which limits substrate design space and the minimum size of the package profile (X, Y, and/or Z dimensions).

In contrast to some electronic device package wire bonding configurations, the electronic device package 100 of FIG. 1 can avoid such wire bond limitations for the electronic component 120. By utilizing the electrical interconnection 134 between the electronic component 120 and the redistribution layer 160, and the electrical interconnection 133 between the redistribution layer 160 and the package substrate 110, the package profile can be reduced. In addition, this configuration can provide flexibility to the design of the package substrate 110.

Figure 3:
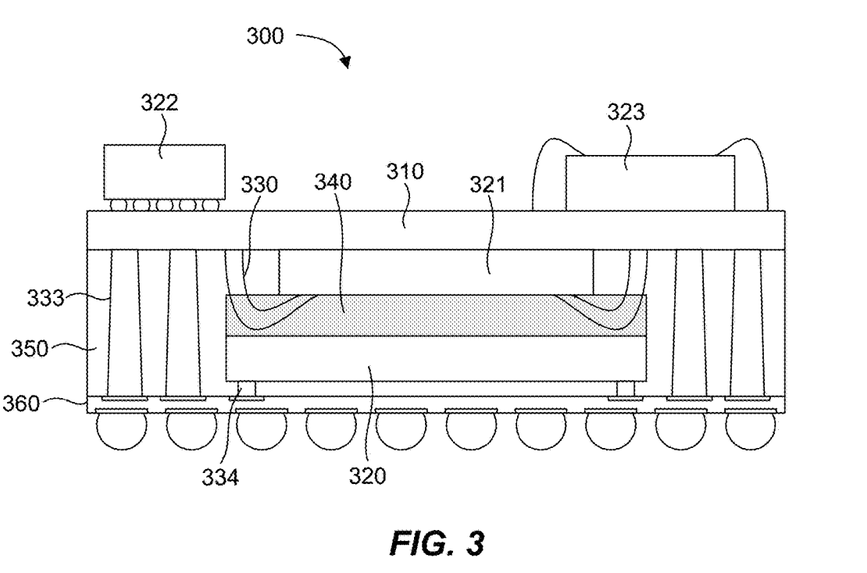
FIG. 3 illustrates a schematic cross-section of an electronic device package in accordance with an example.

FIG. 3 schematically illustrates a cross-section of an electronic device package 300 in accordance with another example. The electronic device package 300 is similar to the electronic device package 100 of FIG. 1 in many respects. For example, the electronic device package 300 includes a package substrate 310 and electronic components 320-323, where the electronic components 320, 321 are in a stacked arrangement separated by a spacer 340 and encapsulated in a mold compound material 350, and the electronic component 321 is electrically coupled to the package substrate 310 by a wire bond connection 330. In addition, the electronic component 300 includes a redistribution layer 360 electrically coupled to the electronic component 320 and the package substrate 310 by electrical interconnects 334, 333, respectively. In this case, the spacer 340 comprises a film over wire (FOW) that can surround at least a portion of the wire bond 330. The electronic device package 300 can therefore provide the benefits discussed above with regard to package profile reduction and package substrate design flexibility while utilizing the FOW spacer 340, which may reduce costs over a silicon spacer.

Figure 4:
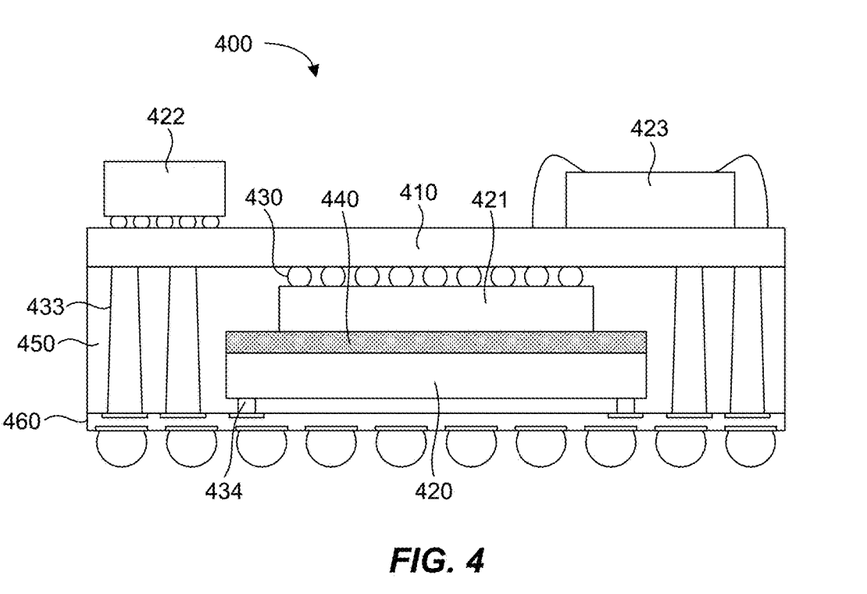
FIG. 4 illustrates a schematic cross-section of an electronic device package in accordance with an example.

FIG. 4 schematically illustrates a cross-section of an electronic device package 400 in accordance with another example of the present disclosure. The electronic device package 400 is similar to the electronic device package 100 of FIG. 1 and the electronic device package 300 of FIG. 3 in many respects. For example, the electronic device package 400 includes a package substrate 410 and electronic components 420-423, where the electronic components 420, 421 are in a stacked arrangement separated by a spacer 440 and encapsulated in a mold compound material 450. Additionally, the electronic device package 400 includes a redistribution layer 460 electrically coupled to the electronic component 420 and the package substrate 410 by electrical interconnects 434, 433, respectively. In this case, the electronic component 421 is connected to the package substrate 410 by solder balls 430. The electronic component 421 can therefore have a flip chip configuration for connection to the package substrate 410. In addition, the spacer 440 comprises a die attach film (DAF) disposed between the electronic components 420, 421. By utilizing low-profile connections instead of direct wire bond connections between the electronic component 420, 421 and the package substrate 410, as well as a low-profile DAF between the electronic components 420, 421, the electronic device package 400 can provide even greater benefits with regard to package profile reduction.

Figure 5:
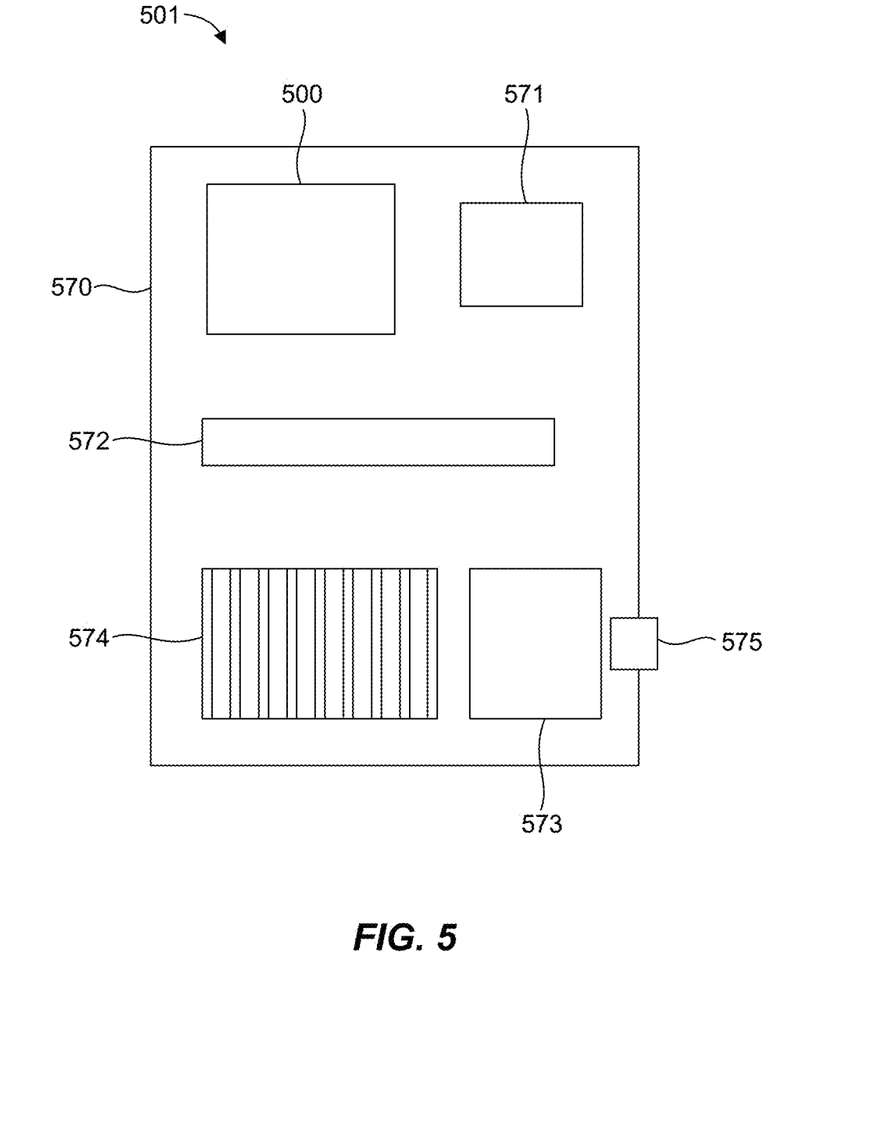
FIG. 5 is a schematic illustration of an exemplary computing system.

FIG. 5 schematically illustrates an example computing system 501. The computing system 501 can include an electronic device package 500 as disclosed herein, coupled to a motherboard 570. In one aspect, the computing system 501 can also include a processor 571, a memory device 572, a radio 573, a cooling system (e.g., a heat sink and/or a heat spreader) 574, a port 575, a slot, or any other suitable device or component, which can be operably coupled to the motherboard 570. The computing system 501 can comprise any type of computing system, such as a desktop computer, a laptop computer, a tablet computer, a smartphone, a server, a wearable electronic device, etc. Other embodiments need not include all of the features specified in FIG. 5, and may include alternative features not specified in FIG. 5.

Examples

The following examples pertain to further embodiments.
In one example there is provided, an electronic device package comprising a package substrate, an electronic component, a mold compound encapsulating the electronic component, and a redistribution layer disposed such that the mold compound is between the package substrate and the redistribution layer, wherein the redistribution layer and the package substrate are electrically coupled, and the redistribution layer and the electronic component are electrically coupled to electrically couple the electronic component and the package substrate.

In one example of an electronic device package, the redistribution layer and the electronic component are electrically coupled by a conductive pillar.

In one example of an electronic device package, the conductive pillar comprises a metal material.

In one example of an electronic device package, the metal material comprises copper.

In one example of an electronic device package, the redistribution layer and the electronic component are electrically coupled by a wire bond connection.

In one example of an electronic device package, the wire bond connection comprises a vertical wire bond connection.

In one example of an electronic device package, the redistribution layer is configured to facilitate electrically coupling the electronic device package with an external electronic component.

In one example, an electronic device package comprises a plurality of solder balls coupled to the redistribution layer to facilitate electrically coupling the electronic device package with the external electronic component.

In one example of an electronic device package, the mold compound comprises an epoxy.

In one example, an electronic device package comprises a second electronic component electrically coupled to the package substrate.

In one example of an electronic device package, the mold compound encapsulates the second electronic component.

In one example of an electronic device package, the first electronic component is in a stacked relationship with the second electronic component.

In one example of an electronic device package, the second electronic component is electrically coupled to the package substrate by a wire bond connection.

In one example, an electronic device package comprises a spacer separating the first electronic component and the second electronic component to provide clearance for the wire bond connection.

In one example of an electronic device package, the spacer comprises a silicon spacer.

In one example of an electronic device package, the spacer comprises a film over wire (FOW).

In one example of an electronic device package, the second electronic component is electrically coupled to the package substrate by a flip chip connection.

In one example, an electronic device package comprises a die attach film (DAF) disposed between the first and second electronic components.

In one example of an electronic device package, the second electronic component comprises an integrated circuit.

In one example of an electronic device package, the integrated circuit comprises an application specific integrated circuit.

In one example of an electronic device package, the first electronic component comprises computer memory.

In one example of an electronic device package, the second electronic component is disposed on a side of the package substrate opposite the first electronic component.

In one example, there is provided a computing system comprising a motherboard, and an electronic device package operably coupled to the motherboard. The electronic device package comprises a package substrate, an electronic component, a mold compound encapsulating the electronic component, and a redistribution layer disposed such that the mold compound is between the package substrate and the redistribution layer, wherein the redistribution layer and the package substrate are electrically coupled, and the redistribution layer and the electronic component are electrically coupled to electrically couple the electronic component and the package substrate.

In one example of a computing system, the computing system comprises a desktop computer, a laptop, a tablet, a smartphone, a server, a wearable electronic device, or a combination thereof.

In one example of a computing system, the computing system further comprises a processor, a memory device, a heat sink, a radio, a slot, a port, or a combination thereof operably coupled to the motherboard.

In one example there is provided a method for making an electronic device package comprising encapsulating an electronic component in a mold compound, disposing a redistribution layer on the mold compound such that the mold compound is between a package substrate and the redistribution layer, electrically coupling the redistribution layer and the package substrate, and electrically coupling the redistribution layer and the electronic component to electrically couple the electronic component and the package substrate.

In one example of a method for making an electronic device package, electrically coupling the redistribution layer and the electronic component comprises forming a conductive pillar.

In one example of a method for making an electronic device package, forming a conductive pillar comprises forming an opening in the mold compound and depositing conductive material in the opening.

In one example of a method for making an electronic device package, forming an opening in the mold compound comprises laser drilling, etching, or a combination thereof.

In one example of a method for making an electronic device package, depositing conductive material in the opening comprises plating, printing, sputtering, or a combination thereof.

In one example of a method for making an electronic device package, the conductive pillar comprises a metal material.

In one example of a method for making an electronic device package, the metal material comprises copper.

In one example of a method for making an electronic device package, electrically coupling the redistribution layer and the electronic component comprises forming a wire bond connection.

In one example of a method for making an electronic device package, the wire bond connection comprises a vertical wire bond connection.

In one example, a method for making an electronic device package comprises configuring the redistribution layer to facilitate electrically coupling the electronic device package with an external electronic component.

In one example, a method for making an electronic device package comprises coupling a plurality of solder balls to the redistribution layer to facilitate electrically coupling the electronic device package with the external electronic component.

In one example of a method for making an electronic device package, the mold compound comprises an epoxy.

In one example, a method for making an electronic device package comprises electrically coupling a second electronic component to the package substrate.

In one example, a method for making an electronic device package comprises encapsulating the second electronic component in the mold compound.

In one example, a method for making an electronic device package comprises disposing the first electronic component and the second electronic component in a stacked relationship.

In one example of a method for making an electronic device package, electrically coupling the second electronic component to the package substrate comprises forming a wire bond connection.

In one example, a method for making an electronic device package comprises disposing a spacer between the first electronic component and the second electronic component to provide clearance for the wire bond connection.

In one example of a method for making an electronic device package, the spacer comprises a silicon spacer.

In one example of a method for making an electronic device package, the spacer comprises a film over wire (FOW).

In one example of a method for making an electronic device package, the second electronic component is electrically coupled to the package substrate by a flip chip connection.

In one example, a method for making an electronic device package comprises disposing a die attach film (DAF) between the first and second electronic components.

In one example of a method for making an electronic device package, the second electronic component comprises an integrated circuit.

In one example of a method for making an electronic device package, the integrated circuit comprises an application specific integrated circuit.

In one example of a method for making an electronic device package, the first electronic component comprises computer memory.

In one example, a method for making an electronic device package comprises disposing the second electronic component on a side of the package substrate opposite the first electronic component.

In one example of a method for making an electronic device package, electrically coupling the redistribution layer and the package substrate comprises forming a via through the mold compound.

In one example of a method for making an electronic device package, forming a via through the mold compound comprises forming an opening in the mold compound and depositing conductive material in the opening.

In one example of a method for making an electronic device package, forming an opening in the mold compound comprises laser drilling, etching, or a combination thereof.

In one example of a method for making an electronic device package, depositing conductive material in the opening comprises plating, printing, sputtering, or a combination thereof.

In one example there is provided a method for minimizing a size of an electronic device package comprising electrically coupling a first electronic component to a package substrate, disposing a second electronic component in a stacked relationship with the first electronic component, encapsulating the first and second electronic components in a mold compound, disposing a redistribution layer on the mold compound such that the mold compound is between the package substrate and the redistribution layer, electrically coupling the redistribution layer and the package substrate, and electrically coupling the redistribution layer and the second electronic component to electrically couple the second electronic component and the package substrate.

In one example of a method for minimizing a size of an electronic device package, electrically coupling the redistribution layer and the second electronic component comprises forming a conductive pillar.

In one example of a method for minimizing a size of an electronic device package, forming a conductive pillar comprises forming an opening in the mold compound and depositing conductive material in the opening.

In one example of a method for minimizing a size of an electronic device package, forming an opening in the mold compound comprises laser drilling, etching, or a combination thereof.

In one example of a method for minimizing a size of an electronic device package, depositing conductive material in the opening comprises plating, printing, sputtering, or a combination thereof.

In one example of a method for minimizing a size of an electronic device package, the conductive pillar comprises a metal material.

In one example of a method for minimizing a size of an electronic device package, the metal material comprises copper.

In one example of a method for minimizing a size of an electronic device package, electrically coupling the redistribution layer and the second electronic component comprises forming a wire bond connection.

In one example of a method for minimizing a size of an electronic device package, the wire bond connection comprises a vertical wire bond connection.

In one example, a method for minimizing a size of an electronic device package comprises configuring the redistribution layer to facilitate electrically coupling the electronic device package with an external electronic component.

In one example, a method for minimizing a size of an electronic device package comprises coupling a plurality of solder balls to the redistribution layer to facilitate electrically coupling the electronic device package with the external electronic component.

In one example of a method for minimizing a size of an electronic device package, the mold compound comprises an epoxy.

In one example of a method for minimizing a size of an electronic device package, electrically coupling the first electronic component to the package substrate comprises forming a wire bond connection.

In one example, a method for minimizing a size of an electronic device package comprises disposing a spacer between the first electronic component and the second electronic component to provide clearance for the wire bond connection.

In one example of a method for minimizing a size of an electronic device package, the spacer comprises a silicon spacer.

In one example of a method for minimizing a size of an electronic device package, the spacer comprises a film over wire (FOW).

In one example of a method for minimizing a size of an electronic device package, the first electronic component is electrically coupled to the package substrate by a flip chip connection.

In one example, a method for minimizing a size of an electronic device package comprises disposing a die attach film (DAF) between the first and second electronic components.

In one example of a method for minimizing a size of an electronic device package, the first electronic component comprises an integrated circuit.

In one example of a method for minimizing a size of an electronic device package, the integrated circuit comprises an application specific integrated circuit.

In one example of a method for minimizing a size of an electronic device package, the second electronic component comprises computer memory.

In one example, a method for minimizing a size of an electronic device package comprises disposing a third electronic component on a side of the package substrate opposite the first and second electronic components.

In one example of a method for minimizing a size of an electronic device package, electrically coupling the redistribution layer and the package substrate comprises forming a via through the mold compound.

In one example of a method for minimizing a size of an electronic device package, forming a via through the mold compound comprises forming an opening in the mold compound and depositing conductive material in the opening.

In one example of a method for minimizing a size of an electronic device package, forming an opening in the mold compound comprises laser drilling, etching, or a combination thereof.

In one example of a method for minimizing a size of an electronic device package, depositing conductive material in the opening comprises plating, printing, sputtering, or a combination thereof.

While the forgoing examples are illustrative of the specific embodiments in one or more particular applications, it will be apparent to those of ordinary skill in the art that numerous modifications in form, usage and details of implementation can be made without departing from the principles and concepts articulated herein.

What is claimed is:

1. An electronic device package, comprising:
   a package substrate;
   first and second electronic components in a stacked relationship, the second component electrically coupled to the package substrate by a wire bond connection;
   a mold compound encapsulating the first and second electronic components;
   a spacer comprising a film over wire (FOW) separating the first and second electronic components to provide clearance for the wire bond connection; and
   a redistribution layer disposed such that the mold compound is between the package substrate and the redistribution layer, wherein the redistribution layer and the package substrate are electrically coupled, and the redistribution layer and the first electronic component are electrically coupled to electrically couple the first electronic component and the package substrate.

2. The electronic device package of claim 1, wherein the redistribution layer and the first electronic component are electrically coupled by a conductive pillar.

3. The electronic device package of claim 1, wherein the redistribution layer and the first electronic component are electrically coupled by a wire bond connection.

4. The electronic device package of claim 1, wherein the redistribution layer is configured to facilitate electrically coupling the electronic device package with an external electronic component.

5. The electronic device package of claim 1, wherein the mold compound comprises an epoxy.

6. The electronic device package of claim 1, wherein the second electronic component comprises an integrated circuit.

7. The electronic device package of claim 1, further comprising a third electronic component electrically coupled to the package substrate.

8. The electronic device package of claim 1, further comprising a fourth electronic component electrically coupled to the package substrate.

9. A computing system, comprising:
   a motherboard; and
   an electronic device package as recited in claim 1, operably coupled to the motherboard.

10. The electronic device package of claim 2, wherein the conductive pillar comprises a metal material.

11. The electronic device package of claim 10, wherein the metal material comprises copper.

12. The electronic device package of claim 3, wherein the wire bond connection comprises a vertical wire bond connection.

13. The electronic device package of claim 4, further comprising a plurality of solder balls coupled to the redistribution layer to facilitate electrically coupling the electronic device package with the external electronic component.

14. The electronic device package of claim 6, wherein the integrated circuit comprises an application specific integrated circuit.

15. The electronic device package of claim 6, wherein the first electronic component comprises computer memory.

16. The electronic device package of claim 7, wherein the third electronic component is disposed on a side of the package substrate opposite the first electronic component.

17. The electronic device package of claim 7, wherein the third electronic component is electrically coupled to the package substrate with either solder balls or a wire bond connection.

18. The electronic device package of claim 17, wherein the third electronic component is electrically coupled to the package substrate with solder balls.

19. The electronic device package of claim 8, wherein the fourth electronic component is disposed on a side of the package substrate opposite the first electronic component.

20. The electronic device package of claim 8, wherein the fourth electronic component is electrically coupled to the package substrate with either solder balls or a wire bond connection.

21. The system of claim 8, wherein the computing system comprises a desktop computer, a laptop, a tablet, a smartphone, a server, a wearable electronic device, or a combination thereof.

22. The system of claim 8, further comprising a processor, a memory device, a heat sink, a radio, a slot, a port, or a combination thereof operably coupled to the motherboard.

23. The electronic device package of claim 20, wherein the fourth electronic component is electrically coupled to the package substrate with a wire bond connection.

* * * * *